(12) United States Patent
Potter et al.

(10) Patent No.: US 9,689,939 B2
(45) Date of Patent: Jun. 27, 2017

(54) SPLIT BIRDCAGE COIL, DEVICES, AND METHODS

(71) Applicant: UNIVERSITY OF GEORGIA RESEARCH FOUNDATION, INC., Athens, GA (US)

(72) Inventors: William M. Potter, Athens, GA (US); Qun Zhao, Watkinsville, GA (US)

(73) Assignee: University of Georgia Research Foundation, Inc., Athens, GA (US)

( * ) Notice: Subject to any disclaimer, the term of this patent is extended or adjusted under 35 U.S.C. 154(b) by 597 days.

(21) Appl. No.: 14/048,148

(22) Filed: Oct. 8, 2013

(65) Prior Publication Data

US 2014/0097838 A1 Apr. 10, 2014

Related U.S. Application Data

(60) Provisional application No. 61/712,024, filed on Oct. 10, 2012.

(51) Int. Cl.
*G01V 3/00* (2006.01)
*G01R 33/3415* (2006.01)
(Continued)

(52) U.S. Cl.
CPC ..... *G01R 33/3415* (2013.01); *G01R 33/34076* (2013.01); *G01R 33/3635* (2013.01)

(58) Field of Classification Search
CPC .......... G01R 33/3415; G01R 33/34076; G01R 33/3635
(Continued)

(56) References Cited

U.S. PATENT DOCUMENTS 4,799,016 A \* 1/1989 Rezvani ........... G01R 33/34046
324/318
5,144,240 A 9/1992 Mehdizadeh et al.
(Continued)

FOREIGN PATENT DOCUMENTS

EP 0301232 A2 \* 2/1989 ....... G01R 33/34046

OTHER PUBLICATIONS

Asfour, "Design and Development of a New Dedicated RF Sensor for the MRI of Rat Brain", 2010, SciRes.\*
(Continued)

*Primary Examiner* — Susan Lee
(74) *Attorney, Agent, or Firm* — Mueting, Raasch & Gebhardt, P.A.

(57) ABSTRACT

This disclosure describes, in one aspect, a device that includes a dual-tuned birdcage coil. The dual-tuned birdcage coil generally includes an inner multinuclear coil and a plurality of outer $^1H$ coils separated from the inner coil. Also, the dual-tuned birdcage coil is generally configured so that the inner coil may be tuned independently of one or more of the outer coils. In some embodiments, the device may be configured to provide inductive coupling between the inner coil and the plurality of outer coils. In some embodiments, the multinuclear coil can include $^{31}P$, $^{13}C$, $^{23}Na$, $^{15}N$, $^{17}O$, or $^{19}F$, etc. In another aspect, this disclosure describes using the device to a generate magnetic resonance in a target. In some cases, the method can further include creating an image of the target from the magnetic resonance generated by the device.

9 Claims, 5 Drawing Sheets

Split Birdcage Coil 127.72MHz and 51.7MHz Layout

Flexible Surface Coil

Matching Circuit (MC)

Phase Compensation Circuit (PCC)

(51) Int. Cl.
G01R 33/34 (2006.01)
G01R 33/36 (2006.01)
(58) Field of Classification Search
USPC .......................................................... 324/309
See application file for complete search history.

(56) References Cited

U.S. PATENT DOCUMENTS

| | | | | |
|---|---|---|---|---|
| 5,999,000 A * | 12/1999 | Srinivasan | ....... | G01R 33/34046 324/318 |
| 6,100,694 A | 8/2000 | Wong | | |
| 6,420,871 B1 | 7/2002 | Wong et al. | | |
| 6,522,143 B1 * | 2/2003 | Fujita | ............... | G01R 33/34046 324/318 |
| 7,123,012 B2 | 10/2006 | Srinivasan | | |
| 7,501,828 B1 | 3/2009 | Wong et al. | | |
| 8,035,384 B2 * | 10/2011 | Saha | ................ | G01R 33/34046 324/318 |
| 8,049,501 B2 | 11/2011 | Hancu et al. | | |
| 8,049,504 B2 | 11/2011 | Findeklee | | |
| 8,106,655 B2 * | 1/2012 | Hyde | ................ | G01R 33/5601 324/309 |
| 2004/0137872 A1 * | 7/2004 | Srinivasan | ....... | G01R 33/34046 455/344 |
| 2004/0189304 A1 * | 9/2004 | Anderson | ........ | G01R 33/34046 324/322 |
| 2008/0278167 A1 * | 11/2008 | Vaughan, Jr. | ...... | G01R 33/3635 324/318 |
| 2009/0160442 A1 * | 6/2009 | Mazurkewitz | ..... | G01R 33/3635 324/318 |
| 2009/0237077 A1 * | 9/2009 | Vaughan | ............ | G01R 33/3415 324/307 |
| 2009/0251145 A1 * | 10/2009 | Kaneko | ............ | G01R 33/34076 324/318 |
| 2010/0117642 A1 * | 5/2010 | Zhai | ................. | G01R 33/34046 324/307 |
| 2010/0253333 A1 * | 10/2010 | Zhai | ................. | G01R 33/34076 324/307 |
| 2012/0112748 A1 * | 5/2012 | Hetherington | ..... | G01R 33/3415 324/318 |
| 2012/0156139 A1 * | 6/2012 | Katz-Brull | ........... | A61K 31/136 424/9.3 |

OTHER PUBLICATIONS

Murphy-Boesch, "Double-Tuned Birdcage Coils: Construction and Tuning", 2007, John Wiley & Sons, LTD.*
Potter, "Radiofrequency Coil Design and Application to Magnetic Resonance Imaging and Control of Micro-Beads" PhD Dissertation, The University of Georgia, 2012; 90 pages.
Balanis, *Advanced Engineering Electromagnetics*, 2nd ed. John Wiley & Sons: Hoboken, N.J.; 2012. Cover page, title page and table of contents. 19 pages.
Chen et al., "Numerical simulation of SAR and B1-field inhomogeneity of shielded RF coils loaded with the human head" IEEE Trans Biomed Eng, May 1998; 45(5):650-9.
Collins et al., "SAR and B1 field distributions in a heterogeneous human head model within a birdcage coil. Specific energy absorption rate" Magn Reson Med, Dec. 1998; 40(6):847-56.
Cureton et al., "Dietary quercetin supplementation is not ergogenic in untrained men" J Appl Physiol, Oct. 2009; 107:1095-104.
Duan et al., "Computational and experimental optimization of a double-tuned (1)H/(31)P four-ring birdcage head coil for MRS at 3T" J Magn Reson Imaging, Jan. 2009; 29(1):13-22.
Fitzsimmons et al., "Double resonant quadrature birdcage" Magn Reson Med, Jul. 1993; 30(1):107-14.
Forbes et al., "Phosphocreatine recovery kinetics following low- and high-intensity exercise in human triceps surae and rat posterior hindlimb muscles" Am J Physiol Regul Integr Comp Physiol, 2009; 296:R161-70.
Forbes et al., "Comparison of oxidative capacity among leg muscles in humans using gated 31P 2-D chemical shift imaging" NMR Biomed, Dec. 2009; 22(10):1063-71.
Goldstein et al., "Molecular neurodevelopment: An in vivo P-31-H-1 MRSI study" J Int Neuropsychol Soc, 2009; 15:671-83.
Gonen et al., "Dual interleaved 1H and proton-decoupled-31P in vivo chemical shift imaging of human brain" Magn Reson Med, Jul. 1994; 32(1):104-9.
Gonen et al., "Simultaneous and interleaved multinuclear chemical-shift imaging, a method for concurrent, localized spectroscopy" J Magn Reson B, May 1994; 104(1):26-33.
Greenman et al., "Evaluation of the RF field uniformity of a double-tuned 31P/1H birdcage RF coil for spin-echo MRI/MRS of the diabetic foot" J Magn Reson Imaging, Sep. 2005; 22(3):427-32.
Haacke, *Magnetic resonance imaging:physical principles and sequence design*, 1$^{st}$ Edition. Wiley-Liss: New York, New York; 1999. Cover page, title page and table of contents.
Hayes, "The development of the birdcage resonator: a historical perspective" NMR Biomed, Nov. 2009; 22(9):908-18.
Hoult et al., "The signal-to-noise ratio of the nuclear magnetic resonance experiment. 1976" J Magn Reson, Dec. 2011; 213(2):329-43.
Hudson et al., "Open access birdcage coils for microscopic imaging of plants at 11.7 T" MAGMA, Jun. 2000; 10(2):69-74.
Hudson et al., "Dual resonant birdcage coils for 1H detected 13C microscopic imaging at 11.7 T" MAGMA, Jun. 2000; 10(2):61-8.
Ibrahim et al., "B-1 field homogeneity and SAR calculations for the birdcage coil" Phys Med Biol, Feb. 2001; 46(2):609-19.
Ibrahim et al., "Insight into RF power requirements and B1 field homogeneity for human MRI via rigorous FDTD approach" J Magn Reson Imaging, Jun. 2007; 25(6):1235-47.
Inan, *Electromagnetic Waves*, 1$^{st}$ edition. Prentice Hall: Upper Saddle River, New Jersey; 1999. Cover page, title page and table of contents.
Jin et al., "On the SAR and field inhomogeneity of birdcage coils loaded with the human head" Magn Reson Med, Dec. 1997; 38(6):953-63.
Joseph et al., "A technique for double resonant operation of birdcage imaging coils" IEEE Trans Med Imaging, 1989; 8(3):286-94.
Jost et al., "Quantitative single-voxel spectroscopy: the reciprocity principle for receive-only head coils" J Magn Reson Imaging, Jan. 2005; 21(1):66-71.
Kemp et al., "Quantitative interpretation of bioenergetic data from 31P and 1H magnetic resonance spectroscopic studies of skeletal muscle: an analytical review" Magn Reson Q, 1994; 10:43-63.
Lattanzi et al., "Electrodynamic constraints on homogeneity and radiofrequency power deposition in multiple coil excitations" Magn Reson Med, 2009; 61:315-34.
Leifer, "Resonant modes of the birdcage coil" J Magn Reson, Jan. 1997; 124(1):51-60.
Liu et al., "Effects of end-ring/shield configuration on homogeneity and signal-to-noise ratio in a birdcage-type coil loaded with a human head" Magn Reson Med, 2004; 51:217-21.
Lupu et al., "An efficient design for birdcage probes dedicated to small-animal imaging experiments" MAGMA, Dec. 2004; 17(3-6):363-71.
Matson et al., "A practical double-tuned 1H/31P quadrature birdcage headcoil optimized for 31P operation" Magn Reson Med, 1999; 42:173-82.
McCully et al., "Muscle metabolism with blood flow restriction in chronic fatigue syndrome" J Appl Physiol, 2004; 96:871-8.
McCully et al., "The reproducibility of measurements of intramuscular magnesium concentrations and muscle oxidative capacity using 31P MRS" Dyn Med, 2009; 8:5.
McCully et al., "Skeletal muscle metabolism in individuals with spinal cord injury" J Appl Physiol, 2011; 111:143-8.
Murphy-Boesch et al., "Two configurations of the four-ring birdcage coil for 1H imaging and 1H-decoupled 31P spectroscopy of the human head" J Magn Reson B, Feb. 1994; 103(2):103-14.
Olive et al., "Vascular remodeling after spinal cord injury" Med Sci Sports Exerc, Jun. 2003; 35(6):901-7.
Podo, "Tumour phospholipid metabolism" NMR Biomed, Nov. 1999; 12(7):413-39.

(56) References Cited

OTHER PUBLICATIONS

Potter et al., "Evaluation of a New 1H/31P Dual-Tuned Birdcage Coil for 31P Spectroscopy" Concepts Magn Reson Part B Magn Reson Eng., Aug. 1, 2013; 43(3):90-9.
Rath, "Design and Performance of a Double-Tuned Bird-Cage Coil" J Magn Reson, 1969; 86(3):488-495.
Solivera et al., "Assessment of 31P-NMR analysis of phospholipid profiles for potential differential diagnosis of human cerebral tumors" NMR Biomed, Jul. 2009; 22(6):663-74.
Tomanek et al., "Double-frequency birdcage volume coils for 4.7T and 7T" Concepts Magn Reson Part B Magn Reson Eng, Aug. 2005; 26B(1):16-22.
Wang et al., "B1 field, SAR, and SNR comparisons for birdcage, TEM, and microstrip coils at 7T" J Magn Reson Imaging, Aug. 2006; 24(2):439-43.
Wright et al., "Theory and application of array coils in MR spectroscopy" NMR Biomed, Dec. 1997; 10(8):394-410.

* cited by examiner

US 9,689,939 B2

SPLIT BIRDCAGE COIL, DEVICES, AND METHODS

CROSS-REFERENCE TO RELATED APPLICATION

This application claims priority to U.S. Provisional Patent Application Ser. No. 61/712,024, filed Oct. 10, 2013, which is incorporated herein by reference.

GOVERNMENT FUNDING

This invention was made with government support under HD039676 awarded by the National Institutes of Health. The government has certain rights in the invention.

SUMMARY

This disclosure describes, in one aspect, a device that includes a dual-tuned birdcage coil. The dual-tuned birdcage coil generally includes an inner multinuclear coil and a plurality of outer $^1H$ coils separated from the inner coil. Also, the dual-tuned birdcage coil is generally configured so that the inner coil may be tuned independently of one or more of the outer coils. In some embodiments, the device may be configured to provide inductive coupling between the inner coil and the plurality of outer coils. In some embodiments, the multinuclear coil can include nuclei with half-integer spins, such as, $^{15}N$, $^{31}P$, $^{13}C$, $^{23}Na$, $^{17}O$, or $^{19}F$, etc.

In another aspect, this disclosure describes a method that generally includes generating magnetic resonance in a target using any embodiment of the device summarized above. In some embodiments, the target can include a body tissue. In some embodiments, the method can further include detecting the magnetic resonance generated and digitizing the detected magnetic resonance. In some of these embodiments, the method can further include creating an image from the digitized magnetic resonance.

The above summary of the present invention is not intended to describe each disclosed embodiment or every implementation of the present invention. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE FIGURES

FIG. 2. Simulation results from the split birdcage coil are displayed for an axial slice (FIG. 2A) and a coronal slice (FIG. 2B), followed by normalized magnetic field profiles across the FOV for the x-, y-, and z-directions.

DETAILED DESCRIPTION OF ILLUSTRATIVE EMBODIMENTS

Figure 1:
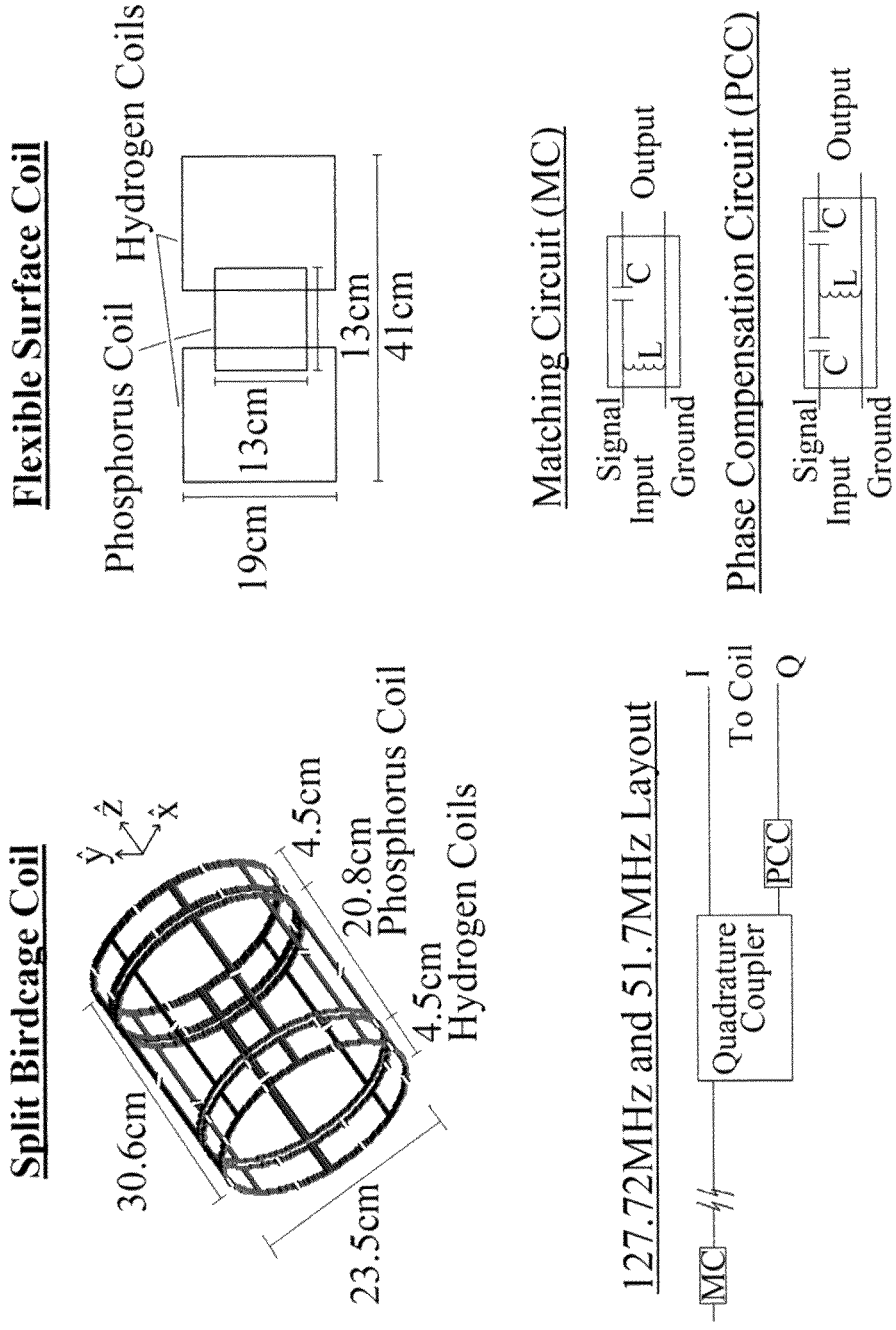
FIG. 1. Schematic showing, the split birdcage coil (Top-Left), the flex surface coil (Top-Right), and the network of matching, splitting, and phase shift compensation to the coil (Bottom). The split birdcage was modeled in xFDTD and used in the simulations for $^1H$ field sensitivity. The constructed coil has a low-pass (LP) inner coil and high-pass (HP) outer coils as seen in this figure. For the proposed split birdcage coil, the matching circuits used were two component circuits composed of a capacitor and an inductor. The phase shifting circuits were T-shape circuits composed of two capacitors and one inductor.
Figure 2A:
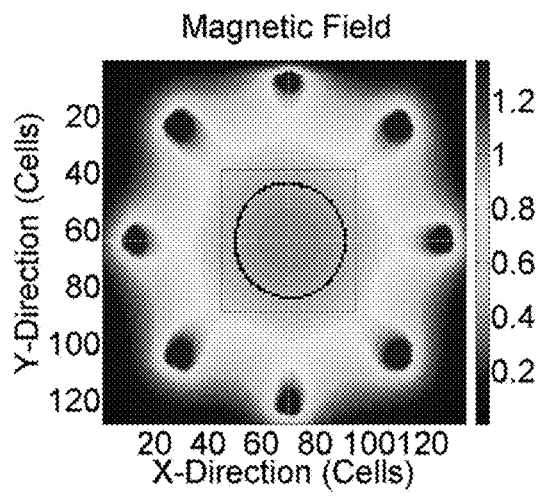
FIG. 2A and FIG. 2B show the magnitude of the normalized field with respect to the center of the ROI/FOV. The x-axes are displayed in units of cells from simulation results (0.21 cm/cell).
Figure 2B:
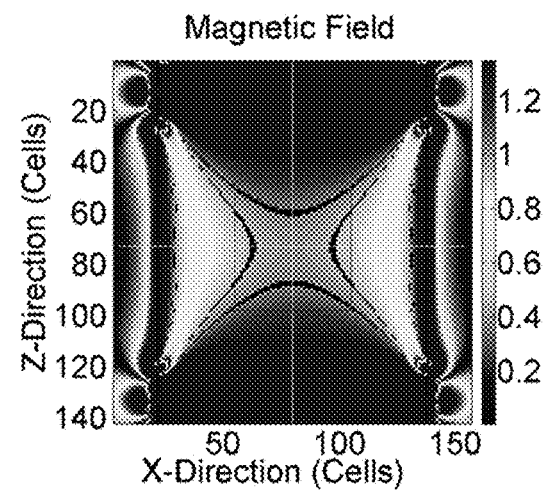
Figure 2C:
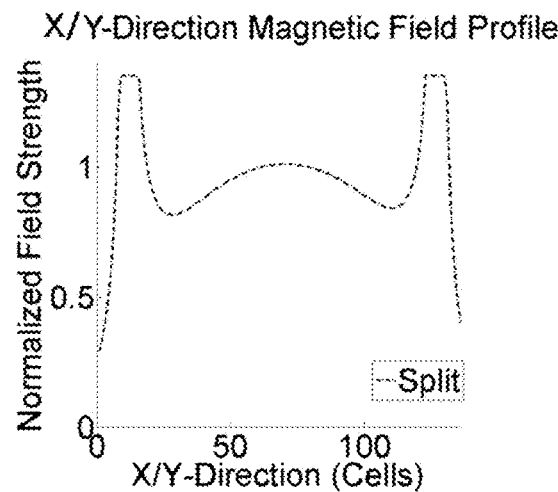
FIG. 2C and FIG. 2D show the x- and z-directed $B_1$ magnetic field profiles across the ROI. The split birdcage coil is homogeneous across the ROI, highlighted by the rectangular box, with an area within 5% deviation encompassing 54.48% of the ROI for the axial slice and 59.40% of the ROI for the coronal slice. The thick black line on graphs (FIG. 2A) and (FIG. 2B) outlines the border of the region of 5% deviation from the field at the center of the ROI. Also, a consistent trend can be seen in the gentle rise to the center of the magnetic field profile in the transverse plane and a smooth fall to the center along the z-axis directed profiles of the coronal slices (FIG. 2D).
Figure 2D:
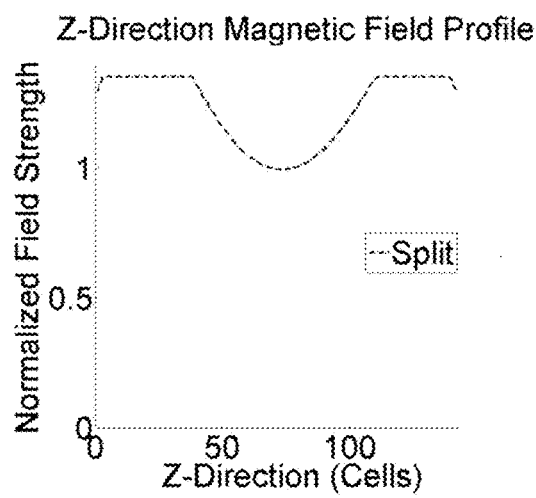

This disclosure describes a new dual-tuned (e.g., $^1H/^{31}P$) birdcage coil, referred to as split birdcage coil. Both simulations and MR experiments on a phantom and human skeletal muscles were used to demonstrate its operation. This design simplifies the practical matters of tuning and matching which makes the coil easy to reproduce. First, simulations were run with the Finite Difference in Time Domain (FDTD) method to compare the magnetic field strength and homogeneity of the design's hydrogen ($^1H$) coils with that of a previously published 4-ring birdcage coil. Following simulations, MR experiments were conducted to compare the new design with a currently available commercial dual-tuned surface coil for signal-to-noise ratio (SNR) as well as homogeneity for the exemplary phosphorous ($^{31}P$) coil.

While described below in the context of an exemplary embodiment in which the inner coil is tuned for $^{31}P$ (e.g., a $^1H/^{31}P$ coil), the devices and methods described herein can involve an inner coil tuned to any suitable nucleus with a half-integer spin. As used herein, a nucleus with a half-integer spin refers to a nucleus with a spin quantum number s (s=n/2), where n is an odd, non-negative integer—i.e., a nucleus where s=1/2, 3/2, 5/2, etc. Exemplary half-integer spin nuclei include, for example $^{15}N$, $^{31}P$, $^{13}C$, $^{23}Na$, $^{17}O$, or $^{19}F$ etc. Compared to $^1H$, a mammalian (e.g., human, mouse, rat) body typically has a relatively low concentration of some half-integer spin nuclei. Through a conventional method of magnetization transfer such as, for example, hyperpolarization by a dynamic nuclear polarization (DNP) process, these nuclei can be transferred (e.g., by injection) to a living body and then imaged.

Dual-tuned (e.g., $^1$H/$^{31}$P) birdcage coils are a well-known and widely used tool for magnetic resonance spectroscopy (MRS). They provide a uniform RF magnetic field inside the coil and can be made to fit most anatomies. The classification for and development of dual-tuned coils has been explored with various nuclei (Hudson et al., June 2000 *Magn Reson Mater Phy*, 10:61-8), at different field strengths (Tomanek et al., August 2005 *Concepts Magn Reson Part B Magn Reson Eng*, 26B:16-22), and by acquiring spectra from animals to the human brain. A two-in-one structure of such a coil solves practical issues that arise from having to use two separate coils or having to reposition the subject in the scanner. When spectral signal is localized to a specific region of tissue, it becomes very important to acquire a suitable anatomical image along with a multinuclear spectrum from the exact same tissue.

MRS can be used for the study of an assortment of different metabolites in the human body. Oxidative metabolism indices, such as kinetic changes in phosphocreatine (PCr), are indicators of biochemical processes (Kemp and Radda, March 1994 *Magn Reson Q*, 10:43-63; McCully et al., March 2004 *J Appl Physiol*, 96:871-8). MRS of phosphorous ($^{31}$P MRS) is well suited to monitor these processes in both skeletal muscles and neuronal synaptic development in human brains. However, the $^{31}$P MRS signal sensitivity is usually low due, at least in part, to low concentrations of the nucleus, a relatively small gyromagnetic ratio compared to $^1$H, and magnetic field inhomogeneity from currently available commercial surface coils. Birdcage coils, on the other hand, give homogeneous magnetic fields and high efficiency at low specific absorption rates (SARs). This point has been demonstrated in the past by simulating $B_1$ magnetic field maps in order to analyze homogeneity along with SAR calculations with a simulated model of the human body loaded in the coil.

The practicality of building a dual-tuned birdcage coil is not trivial and can be a complex endeavor to approach due to many factors. For example, what type of birdcage is the easiest to tune and match, which kind gives the best homogeneity, the largest sampling volume, and a maximum or minimum coupling. "Coupling" is used loosely here in that coupling from two coils, directly connected, should be minimized to reduce the procedure of iterative tuning. The other sense of "coupling" refers to two coils ($^1$H coils for example) that couple through a central coil (e.g., $^{31}$P) to increase the signal sensitivity of the first two coils. This type of coupling should be maximized in order to acquire the best signal. The structure of the coil (e.g., number of legs/rings, dimensions, ratio of length to diameter) affects signal acquisition from the two different nuclei. Existing examples of dual-tuned birdcage coils include the 4-ring birdcage (Duan et al., January 2009 *J Magn Reson Imaging*, 29:13-22; Murphy-Boesch et al., February 1994 *J Magn Reson B*, 103:103-14), concentric birdcages (Fitzsimmons et al., July 1993 *Magn Reson Med*, 30:107-14; Hudson et al., June 2000 *Magn Reson Mater Phy*, 10:61-8), and the alternating rung birdcage (Joseph and Lu, 1989 *IEEE Trans Med Imaging*, 8:286-94; Tomanek et al., August 2005 *Concepts Magn Reson Part B Magn Reson Eng*, 26B:16-22). All of these either share endrings or share enclosed sampling volumes.

In this study of human skeletal muscle metabolism, the 4-ring design was initially chosen for its large multinuclear sampling volume. However, it was found that construction of this coil required an iterative process of tuning the inner and outer coils, until the desired resonant frequency for each was reached, and this makes the coil hard to reproduce. This coil can be an effective dual-tuned coil because the impedance from the capacitors of the outer coils are large as seen by circulating power at the resonant frequency of the inner coil. Therefore power from excitation of the inner coil will stay in the inner coil (Murphy-Boesch et al., February 1994 *J Magn Reson B*, 103:103-14). The 4-ring design is unique because its outer coils use the connection of the inner coil to produce a co-rotating and counterrotating current distribution, reflected as a frequency split in the primary resonance mode.

To overcome the tuning difficulty and make the coil easily reproducible, we created a split birdcage coil. The purpose of the split design is to still use the coupling through the center or inner coil, but to separate the coils' direct connection to allow for the individual tuning of each coil.

Another goal of this study was to compare the split birdcage coil against a commercially available dual-tuned surface coil. The intention was to find out whether our new design of birdcage coil could compete with the commercial coil that is used for most multinuclear spectroscopy needs. Surface coils have been used to measure PCr signal in the vastus lateralis muscle in the thigh. This muscle typically has the thinnest section of fat covering it so that it is the closest muscle in the thigh to the coil (McCully et al., 2009 *Dyn Med*, 8:5). In order to acquire data from another muscle or muscle group, the coil must be shifted and repositioned (Forbes et al., December 2009 *NMR Biomed*, 22:1063-71).

In this work, a comparison for the coils' sensitivity or magnetic field homogeneity and SNR is presented as simulation between the 4-ring birdcage and the split birdcage as experiment between the split birdcage coil and a commercial flex surface coil for their ability to localize and characterize a single muscle. All anatomical and spectroscopic signals were acquired from a phantom and a human volunteer using a GE 3T HDx magnet.

In principle, the split birdcage design uses inductive coupling between the outer coils and the inner coil in order to produce the same effect of co-rotating and counterrotating modes as the 4-ring coil design. The coupling occurs between every mesh loop from one coil to every mesh loop in the adjacent coil. However, the strongest coupling occurs in the z-direction between endrings and is related to the flux from one endring to the next as described by Lenz's Law. The sinusoidal current that is produced on the legs of the birdcage, also travels around the endrings for the coil that is being excited. Lenz's Law says that magnetic flux through a closed loop will produce a current in a neighboring loop that will try to oppose the changing magnetic field. This induced current in the endring produces a current along the legs of the inner coil and thus a rotating magnetic field that is greater and more homogeneous than a rotating magnetic field produced by two $^1$H coils with no $^{31}$P coil between them.

The split birdcage coil was constructed with a large acrylic tube for the frame of the coil. Heat resistant tape and copper tape were laid down in the pattern of three separated 8-leg birdcages on a plastic film and wrapped around the acrylic tube. In this work a split design coil was built for its large multinuclear sampling volume, its use of inductive coupling between the coils, and its full use of all of the legs in the coil. However, in contrast to the simulations of a LP-LP coil, a LP-HP design was chosen because the value of the capacitors used in the HP outer coils is larger than the equivalent LP birdcage with the same dimensions. Also, it is easier to obtain symmetry around the HP coil, because there are twice as many capacitors to work with. The prototype was built as an adaptation of this coil with an initial space of 0.4 cm between the inner coil and the HP outer coils. Additional components to our design include two quadrature couplers, multi-component matching circuits and phase shifters, non-magnetic coaxial cable, and a protective plastic shell.

The inner $^{31}$P coil was tuned to 51.7 MHz with a capacitance at each leg of 21.2 pF. The inner coil was excited with quadrature excitation. Two equal length coaxial cables were used to deliver power to the coil at two capacitors that were 90 degrees from each other, yielding an improvement in SNR of the square root of 2 over linear excitation. A quadrature coupler (30 MHz to 88 MHz, Innovative Power Products, Holbrook, N.Y., USA) was used for this purpose. A T-shaped phase shifter was used for the inner $^{31}$P coil to correct the phase shift to exactly 90 degrees. The two outer $^{1}$H coils were each tuned to 127.75 MHz. Finally, two matching circuits were used to match each coil to 50 Ohms. Excitation on the $^{1}$H coils gave unloaded and loaded Q-factors of 125 and 90 respectively, while excitation on the $^{31}$P coil gave unloaded and loaded Q-factors of 89 and 25 respectively.

A large bottle 18 cm in diameter and 25 cm in length filled with a 100 mM concentration of $KH_2PO_4$ was used for tuning. Tuning was also done with the human leg as a loading to ensure a realistic situation from the bench to the scanner. When the two outer coils were connected simultaneously, we observed the co-rotating and counterrotating modes for each peak (Murphy-Boesch et al., February 1994 J Magn Reson B, 103:103-14). We tuned the co-rotating mode down to 127.75 MHz with a capacitance at each leg of 27.9 pF and then matched the outer coils to 50 Ohms.

The objective of the simulation was to show whether the new split birdcage coil is a feasible version that utilizes the same phenomena as the 4-ring coil in terms of producing a homogeneous magnetic field for $^{1}$H in the center of the coil. Simulated for this study were two different birdcage coils, the 4-ring design and the split design, as shown in FIG. 1, along with a simulated test for various distances between coils in the split design. The new split design dual-tuned birdcage coil in this study was chosen from the 4-ring low-pass low-pass (LP-LP) design, which refers to capacitors placed on the legs of the inner and outer coils, and simulated as such where the two outer coils are tuned for $^{1}$H and the inner coil is tuned for $^{31}$P. The simulated coils were designed to be LP-LP so that the excitation sources could be placed easily and reliably in the simulation (sources could only be directed in the 3 Cartesian directions)

The optimization of the physical parameters of a 4-ring dual-tuned coil has been explored in the past (Duan et al., January 2009 J Magn Reson Imaging, 29:13-22; Matson et al., July 1999 Magn Reson Med, 42:173-82; Murphy-Boesch et al., February 1994 J Magn Reson B, 103:103-14). However, the coils for this experiment are intended for imaging of the adult human thigh. The diameter, length of the inner coil, length of the outer coil, and coil separation (for the split design only) were set at 23.45 cm, 20.79 cm, 4.51 cm, and 0.4 cm.

Simulations were run with a finite difference time domain program, xFDTD (Remcom, State College, Pa.), to calculate and map the magnetic field. Since the physical dimensions of the $^{31}$P coil on each dual-tuned birdcage were the same and each coil was centered on the sampling region, simulations were not run for it. The split birdcage coil used three separate LP coils in a line. The 4-ring dual-tuned LP-LP birdcage coil uses four conducting rings connected with conducting legs that form three individual sections, an inner section and two outer sections. In each case, the outer sections are tuned for $^{1}$H imaging (127.72 MHz for Hydrogen at 3T) and the inner section is tuned for $^{31}$P MRS (51.7 MHz for phosphorus at 3T). The overall grid size for the simulations was set to be somewhat larger than the size of the coil, and an adaptive grid was used that had a cell size of 2.58 mm in the region of the coil and 21.66 mm far from the coil. Ten cycles were run to make sure that a steady state had been reached and a slice across the x-y or y-z plane was chosen at the same time point from each of the three simulations. The primary mode of a LP or HP birdcage coil has a sinusoidal current distribution around the legs of the coil which produces a rotating magnetic field in the center of the coil. This sinusoidal current wave propagates around the legs as well as a net sinusoidal current wave around the endrings. Rather than tuning simulated capacitors at each leg of the inner birdcage coil, the magnetic field was generated with z-axis directed sinusoidal voltage sources of value 1V placed at the midpoint of each leg of the $^{1}$H coils, at a frequency of 127.75 MHz and phase shifted to form a sinusoidal current distribution, i.e., 0 degrees, 45 degrees, 90 degrees, 135 degrees, 180 degrees, 225 degrees, 270 degrees, and 315 degrees for the 8-leg coil in this study. Capacitances placed on the inner coil were experimentally found on the bench for resonance at 51.7 MHz. Each capacitor was 23.0 pF for the 8-leg coil. The resulting magnetic field is denoted with the real-valued coefficients of the x- and y-components of the transverse field $C_1x$ and $C_1y$ respectively. Then all of the current sources were phase shifted by 90° to form a cosinusoidal current distribution for a second run of the simulation, resulting in a magnetic field denoted with x- and y-component coefficients $C_2x$ and $C_2y$. The magnitude of the total circularly polarized magnetic field resulting from the quadrature excitation is given by Formula (I).

$$\tfrac{1}{2}\sqrt{(C_{1x}+C_{2y})^2+(C_{2x}-C_{1y})^2} \qquad (1)$$

Because the analysis was performed with free space loading, coil losses and tissue loading were not included in the simulation. According to the principle of reciprocity, a transmit coil's transverse $B_1$ field distribution per unit current is proportional to the signal distribution acquired from the same coil during reception. Therefore, $B_1$ field plots of each coil normalized to the center of each coil will provide a comparison of the coil's sensitivity profiles (Hoult and Richards, December 2011 J Magn Reson, 213:329-43; Jost et al., January 2005 J Magn Reson Imaging, 21:66-71). Instead of presenting an absolute magnetic field, we normalized the $B_1$ fields of each coil to their centers in order to reflect the relative $B_1$ fields of these coils. The normalized magnetic field profile was analyzed and displayed in both the xy-plane (transverse plane) and the yz-plane (coronal plane).

To further understand how the split birdcage coil spacing affects the coil performance, FDTD simulations were run with several different distances between the coils. Distances used included 8 mm, 6 mm, 4 mm, 2 mm, and 0.5 mm. The results were plotted in FIG. 5.

FIG. 2 shows the field maps that are normalized with respect to the center of their ROI obtained from simulation for a central axial slice (A) and a central coronal slice (B) for the split birdcage coil. For both slices, a region of homogeneity that is within 5% of falloff from the center is outlined by a black border as seen in FIG. 2A and FIG. 2B. Also in FIG. 2, because of the symmetry in the axial slice (i.e., x-y plane), only the x-directed and z-directed $B_1$ magnetic field profiles across the ROI are shown for the simulations (C and D). The sensitivity can be seen from the rate at which the field falls off. The area of the 5% homogenous region is 54.48% of the ROI in the axial slice. For the coronal slice, the region of homogeneity is 59.40%, shown in FIG. 2B, by area of the ROI. The plots of the $B_1$ magnetic field profiles along x- and z-direction show that the field rises and falls in a smooth curve passing through the center of the normalized field.

Figure 5:
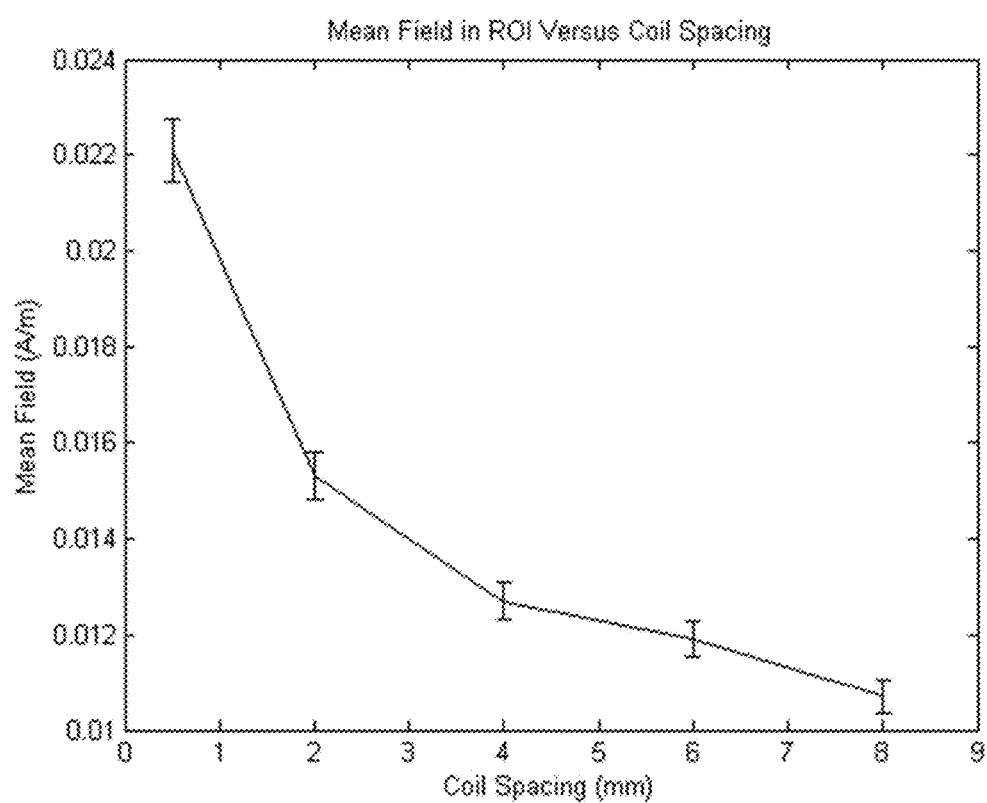
FIG. 5. Simulations of the split birdcage coil were run to show the magnetic field inside of a ROI against the spacing between the coils. The field generated is proportional to the coupling between the coils and that is determined by the distance between the endrings of the $^{31}P$ coil and the $^1H$ coils. The spacing between the coils, in this study, was 4 mm.

FIG. 5 shows the relationship between the spacing of the split coils and the mean magnetic field inside of the ROI. The induced field is inversely proportional to the distance between the coils. This is to show the efficiency of the coil to coil coupling with a fixed input power.

Figure 3:
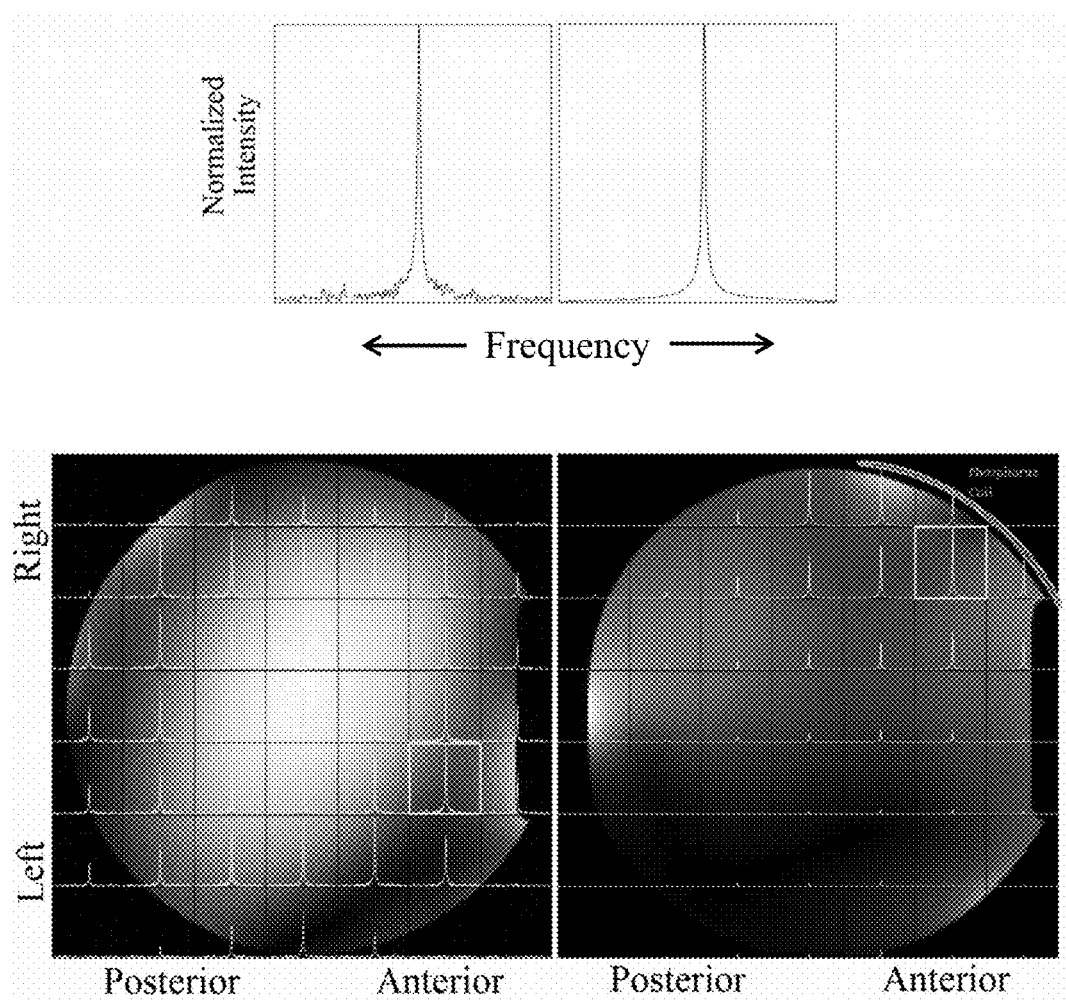
FIG. 3. This compares side by side the overlapped FID-CSI grid on top of the anatomical image for a 100 mM $KH_2PO_4$ phantom for both the split coil (Left) and the flex surface coil (Right). Note that the flex surface coil is over the top right of this image. The spectral peaks were acquired with the same digital, analog, and transmit gains. The $^{31}P$ voxel with the highest intensity peak (shown in the highlighted box) was selected and expanded above.

To compare the homogeneity, the data are displayed as an overlap of the FID-CSI grid on top of the anatomical image. FIG. 3 displays the experimental results acquired from the phantom, with its magnitude of the spectral signal for each voxel in the 7×7 grid overlapped on the anatomical image. In FIG. 3, it was observed from the two 100 mM $KH_2PO_4$ phantom scans that the depth to which the surface coil can acquire $^{31}P$ signal is less than half of the 18 cm diameter phantom. The split birdcage coil, however, obtained signal uniformly from every voxel across the phantom including the voxel in the very center of the grid. As a comparison, the SNR was calculated at each voxel for both coil datasets and displayed in Table 1, which is organized in a way that directly correlates the position of the FID-CSI voxel and the position of the calculated SNR. For the surface coil, the SNR at areas close to the coil was approximately 275 and dropped off quickly with the distance from the coil. For the split birdcage coil, there were many voxels within the phantom that gave a SNR of 100. The best SNR value for the split birdcage was 119.01 while the best SNR for the surface coil was 298.63.

TABLE 1

Numeric values for the SNR from each block in the corresponding FID-CSI grid from FIG. 3. SNR table for A) the split birdcage coil and B) the flex surface coil, physically located at the top right of the FOV of the phantom.

A)

| 8.59 | 15.39 | 66.69 | 44.55 | 40.80 | 26.25 | 9.49 |
| 13.20 | 96.52 | 100.62 | 94.62 | 63.95 | 65.38 | 64.34 |
| 82.68 | 102.83 | 102.70 | 90.69 | 70.01 | 83.77 | 53.47 |
| 72.19 | 106.10 | 99.89 | 102.80 | 112.40 | 119.01 | 69.23 |
| 44.08 | 90.39 | 86.74 | 75.68 | 83.10 | 89.29 | 56.83 |
| 44.14 | 76.64 | 97.34 | 111.48 | 112.39 | 83.92 | 6.48 |
| 3.87 | 21.17 | 56.94 | 68.95 | 46.96 | 6.53 | 5.51 |

B)

| 27.51 | 14.43 | 163.88 | 285.66 | 271.23 | 241.60 | 46.61 |
| 40.76 | 88.07 | 242.05 | 263.93 | 280.58 | 298.63 | 262.25 |
| 46.75 | 72.96 | 70.98 | 175.22 | 218.11 | 279.21 | 254.76 |
| 6.92 | 33.32 | 70.78 | 106.86 | 137.18 | 116.19 | 51.86 |
| 6.07 | 19.64 | 29.89 | 37.67 | 67.96 | 63.92 | 47.42 |
| 8.77 | 19.35 | 53.43 | 45.07 | 73.02 | 20.41 | 34.18 |
| 7.67 | 28.41 | 46.51 | 48.89 | 94.92 | 32.13 | 22.73 |

Figure 4:
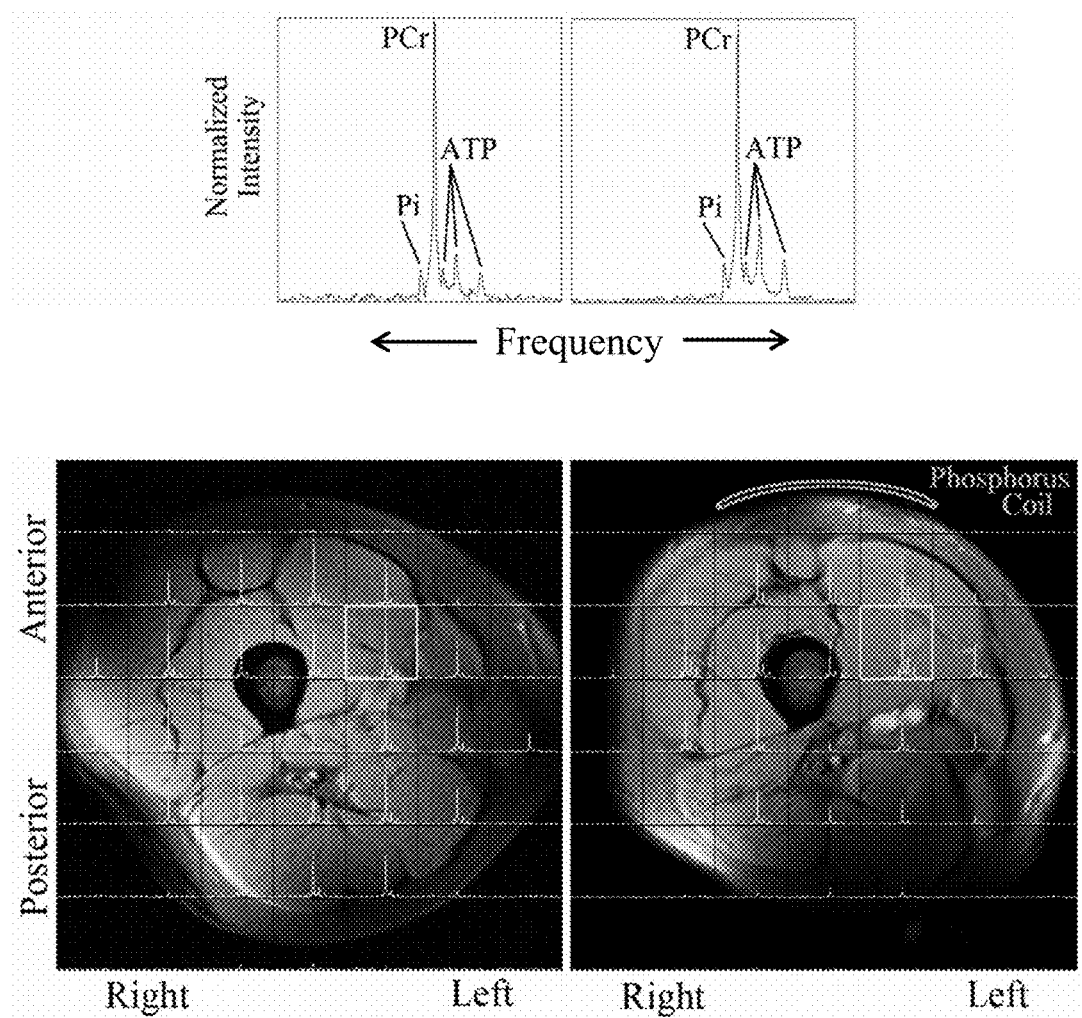
FIG. 4. Overlapped FID-CSI on top of an anatomical image of the human thigh for the split coil (Left) and the flex surface coil (Right). Since the only source for PCr is the muscle, the partial volume effect can be seen at the boundaries of muscle to fat, bone, and blood vessels. There is reduced signal intensity when only part of the voxel is filled with signal producing sample. The $^{31}P$ voxel with the highest intensity PCr peak (shown in the highlighted box) was selected and an expanded view is shown above.

The comparison between the split birdcage and the surface coil for the human thigh is shown in FIG. 4. This display combined with the spatial encoding of the FID-CSI allows for the correlation of signal to a localized region, in particular, to a localized muscle anywhere from the vastus lateralis on the surface of the leg to other muscles deeper in the tissue. The surface coil, when placed around the thigh orients the $^{31}P$ coil slightly off center toward the vastas lateralis muscle on top of the leg. The PCr peaks are visible for the surface coil at grid positions close to the coil. For the split birdcage, a PCr peak appears at every grid position that sits on a piece of muscle. Quantitatively, Table 2 displays the calculated SNR from each voxel in the 7×7 FID-CSI grids. The highest SNR from the split birdcage is 174.45 while that of the surface coil is 305.73.

TABLE 2

Numeric values for the SNR from each block in the corresponding FID-CSI grid from FIG. 4. SNR table for A) the split birdcage coil and B) the flex surface coil, physically located on top of the thigh.

A)

| 4.99 | 8.83 | 5.58 | 7.38 | 8.60 | 8.32 | 6.10 |
| 6.89 | 82.34 | 153.19 | 169.40 | 114.39 | 15.12 | 5.70 |
| 51.23 | 170.17 | 117.48 | 139.11 | 146.47 | 86.33 | 6.58 |
| 77.28 | 152.55 | 71.41 | 66.09 | 138.29 | 159.28 | 53.94 |
| 7.42 | 86.28 | 113.00 | 109.51 | 174.45 | 112.48 | 5.71 |
| 11.64 | 12.74 | 94.41 | 106.14 | 137.96 | 13.15 | 6.39 |
| 5.42 | 7.10 | 14.57 | 17.69 | 10.88 | 6.29 | 4.32 |

B)

| 5.13 | 10.90 | 5.29 | 5.56 | 4.69 | 7.70 | 4.91 |
| 7.95 | 74.60 | 176.93 | 161.37 | 192.78 | 53.10 | 7.12 |
| 34.58 | 239.57 | 205.40 | 121.45 | 305.73 | 124.68 | 23.36 |
| 17.75 | 165.51 | 213.06 | 40.22 | 143.93 | 53.69 | 19.36 |
| 13.39 | 54.92 | 120.61 | 68.34 | 91.37 | 37.29 | 5.99 |
| 4.55 | 14.98 | 22.45 | 37.25 | 35.06 | 5.89 | 6.61 |
| 7.92 | 8.76 | 8.70 | 7.46 | 5.76 | 5.47 | 7.34 |

Previously, it has been shown that for a typical two-ring birdcage, the region of good homogeneity extends almost to the coil legs in the axial slice and almost to the end-rings in the coronal slice (Lupu et al., December 2004 *Magn Reson Mater Phy,* 17:363-71). In principle, the split birdcage design utilizes inductive coupling between the outer coils and the inner coil in order to produce the same effect of co-rotating and counter-rotating modes as the 4-ring coil design without the trouble of iterative tuning. This has been shown to produce a rotating magnetic field in the center of the coil greater than the field produced by the brute force method of using two $^1H$ coils (Duan et al., January 2009 *J Magn Reson Imaging,* 29:13-22; Murphy-Boesch et al., February 1994 *J Magn Reson B,* 103:103-14). Also, it should be noted that when simulating the $^1H$ coils alone, there was a distinct pattern visible from interference between the two $^1H$ coils. This pattern was probably still there to some extent in both the other simulations, but because field strength was an order of magnitude greater than that of the $^1H$ coils alone, the pattern was not seen.

The comparison coil, the surface coil, is designed to surround the ROI with two $^1H$ surface coils parallel to each other making up slightly for the well-known disadvantages of surface coils, like its inability to acquire good signal at a distance away from the coil. This particular point is a textbook rule. However, the reason that this disadvantage is most often overlooked may be that surface coils can be very easy to reproduce reliably. Volume coils on the other hand may be more difficult because they can involve more complexity by way of tuning, particularly dual-tuned volume coils. A volume coil that is easy to reproduce and effective at multinuclear spectroscopy has the advantage over the surface coil counterpart for all applications except attempting to acquire signal right on the surface of a tissue.

For the split birdcage coil, the ability for the two outer coils to acquire signal from a central location far from either $^1$H coil is necessary but does not need to be optimized, for the objective of the coil is multinuclear spectroscopy. Using a split birdcage spacing of 4 mm and comparing it to the 4-ring coil, the mean field strength in the center is half that of the 4-ring coil. However, since the mean field strength depends inversely in an exponential manner, simply decreasing the distance of the spacing from 4 mm to 2 mm or even 1 mm, the mean field strength would approach that of the 4-ring coil in a nonlinear fashion. So long as the coils are not directly connected, tuning may be simplified by dividing the split birdcage coil into three coils.

Simply by visual comparison of the images acquired with both the flex surface coil and the split birdcage coil it's apparent that each coil has some dark spots. The split birdcage has a dark spot in the same pattern that the $^1$H coil simulation showed which means perhaps the image is more susceptible to that interference inside of the scanner. The surface coil has a large dark spot because the material to be imaged is too big for the flexible coil to fit around and therefore a dark spot is left. Neither of these dark spots hinders the function of the coils, however. The SNR for the image is comparable and, in the human thigh scans, all of the anatomy can be seen.

As seen in FIG. 3 and FIG. 4, the $^{31}$P signal drops off rather quickly for the flex coil on the phantom and slightly less quickly for the human thigh scan. The split birdcage on the other hand maintains a uniform $^{31}$P signal across the subject, phantom or human thigh. By comparing the highest SNR from a voxel for the phantom scans for the surface coil and the split birdcage coil, seen in Table 1, it appears that the SNR from the split birdcage is less than half that of the surface coil. However, it also appears that the high SNR value continues to the center of the phantom for the split birdcage coil while the high SNR for the surface coil is limited to the area close to the coil. The voxel with the highest SNR from FIG. 3 is analyzed to show that the SNR value for the split birdcage coil is 119.01 versus 298.63 for the surface coil.

The results from the human thigh dataset were consistent with that of the phantom experiments. The peak SNR value for the birdcage coil, 174.45 was greater than half of the peak SNR value for the surface coil, 305.73, and a good SNR was obtained for all voxels containing skeletal muscle.

Quantitatively speaking, Table 1 and Table 2 convey all of the numerical results for $^{31}$P SNR calculations. They show that the birdcage in fact has a smaller variation in $^{31}$P peak intensity and therefore a more homogeneous B, magnetic field in the axial slice. This is expected based on the fact that these are textbook phenomena. Because of its effectiveness in acquiring signal for imaging and MNS like previous 4-ring birdcage coils while at the same time exhibiting ease of construction and tuning, the split birdcage coil is a better choice for spectroscopy.

Another method for finding homogeneity is to highlight a region that satisfies a criterion such as mean variation is less than 5% or 10%. This method shows the region of good homogeneity and was the method used to display field homogeneity and coil sensitivity from FIG. 2.

This coil has not been attempted before. It reduces practical difficulties inherent in dual-tuned birdcage coils such as complexity in multiple components, capacitor symmetry, iterations of tuning and matching, etc. for tuning the coil to 51.7 MHz and 127.75 MHz respectively for $^{31}$P and $^1$H and matching the coil to 50 Ohms. On the bench, anything that is directly connected to the coil will affect the tuning Having the coils separated means that there are no components in parallel with the individual $^{31}$P coil and $^1$H coils, and individually, the resonant modes produced are the pure modes for a birdcage of each size. Capacitor symmetry is very important when tuning, and additional connected components can create unexpected resonant modes as well as interfere with the symmetry.

This study was designed to introduce the new split birdcage coil while simultaneously evaluating it for eventual performance acquiring localized multinuclear signal from the skeletal muscle of patients that might or might not have a large layer of subcutaneous fat surrounding the muscle. This has been a concern with the available commercial surface coils that would not be able to detect signal from deep inside tissue.

The preliminary simulations compared the design to a previously constructed 4-ring coil and through analysis, it was determined that the split birdcage coil would in fact operate under the same principles as the 4-ring coil. The coil was tested against a commercially available dual-tuned flexible surface coil experimentally by acquiring both $^1$H signal and $^{31}$P spectra from a large 18 cm diameter phantom and a normal, healthy human thigh. The split birdcage coil, because it is a volume coil, gave a more uniform $^{31}$P signal from both the phantom and the human subject, making it a superior choice for acquiring and localizing signal from a particular muscle in the tissue. This is a useful result because of the ease with which the split birdcage coil can be constructed. Having the three coils spaced apart instead of directly connected reduced the iterative tuning process and allowed for individual matching for each section without interference to the other coils. The future of this research will be to consider human subjects with large layers of subcutaneous fat (Olive et al., June 2003 *Med Sci Sports Exerc*, 35:901-7) which act as a buffer between the muscle and the coil. The more fat there is, the greater the distance would be to a surface coil, and the weaker that signal would be. This would not be the case for the split birdcage coil. An in depth analysis has been done in which 10 subjects of varying body mass index (BMI) were selected to compare the split birdcage coil with the surface coil. The results showed a consistently better signal acquisition penetration from the split birdcage coil than from the surface coil. The surface coil could not even reliably obtain signal from the center of the anatomy. This study gave a clear indication of the split birdcage coil's efficacy for acquiring multinuclear signal from regions deep within the tissue. (Potter, W. M. 2012. Radiofrequency Coil Design and Application to Magnetic Resonance Imaging and Control of Micro-Beads. Ph. D. Dissertation, The University of Georgia. 90 p.).

Thus, we describe a new dual-tuned split birdcage coil and compared it to an existing 4-ring birdcage coil and a flex surface coil with simulations and experiments, respectively. The new design of birdcage coil greatly reduced the number of iterations of tuning and matching by taking away the direct connection between the outer $^1$H coils and the inner $^{31}$P coil. This makes it possible to easily build the coil and to adjust the tuning or matching before a scan. The $^{31}$P homogeneity of the split birdcage coil was much better than the flex coil.

As used herein, the term "and/or" means one or all of the listed elements or a combination of any two or more of the listed elements; the terms "comprises" and variations thereof do not have a limiting meaning where these terms appear in the description and claims; unless otherwise specified, "a," "an," "the," and "at least one" are used interchangeably and mean one or more than one; and the recitations of numerical ranges by endpoints include all numbers subsumed within that range (e.g., 1 to 5 includes 1, 1.5, 2, 2.75, 3, 3.80, 4, 5, etc.).

In the preceding description, particular embodiments may be described in isolation for clarity. Unless otherwise expressly specified that the features of a particular embodiment are incompatible with the features of another embodiment, certain embodiments can include a combination of compatible features described herein in connection with one or more embodiments.

For any method disclosed herein that includes discrete steps, the steps may be conducted in any feasible order. And, as appropriate, any combination of two or more steps may be conducted simultaneously.

The present invention is illustrated by the following examples. It is to be understood that the particular examples, materials, amounts, and procedures are to be interpreted broadly in accordance with the scope and spirit of the invention as set forth herein.

EXAMPLE

For comparison purposes, the split birdcage coil, along with a dual-tuned surface coil (Clinical MR Solutions LLC., Brookfield, Wis., USA) were used for data acquisition. The dual-tuned surface coil consists of a single 13 cm×13 cm square $^{31}$P coil, with 20.5 cm by 22.5 cm $^{1}$H coils on either side with 3.25 cm of overlap as seen in FIG. 1. The total length of the surface coil is 41 cm and it is flexible so that it can be wrapped around the subject. The $^{31}$P surface coil was placed on the thigh sized phantom as well as the human thigh so that the $^{31}$P coil was positioned on the right side of the right leg. The phantom as well as the human thigh was centered inside of the birdcage coil. All data were acquired by using a GE 3T HDx magnet (GE medical systems, Milwaukee, Wis.). The protocol for acquisition was first to obtain an anatomical image using a gradient recalled echo (GRE) sequence, followed by a 7×7 free induction decay chemical shift imaging (FID-CSI) sequence. The FID-CSI data were acquired after both auto- and manual-shimming to maximize signal intensity and peak shape.

Parameters for anatomical image acquisition for both the split birdcage coil and the MNS surface coil while imaging the phantom consist of a repetition time (TR) of 350 ms, an echo time (TE) of 10 ms, a flip angle (FA) of 90 degrees, a field of view (FOV) of 18 cm, a slice thickness (STH) of 20 mm, and frequency and phase resolution of 256×256. While imaging the human leg, the parameters were the same for the flex coil, but the parameters for the split birdcage coil were TR of 100 ms, TE of 7 ms, FA of 90 degrees, FOV of 18 cm, and STH of 20 mm. The raw data magnitude map for a central axial slice was saved to be reconstructed later. The FID-CSI data for both the split birdcage coil and the MNS surface coil had these parameters: a TR of 3000 ms, a FA of 90 degrees, a FOV of 18 cm, a STH of 20 mm, and displayed grid dimensions of 7×7. Four excitations were acquired resulting in a scan duration of 10 minutes.

In this study a main objective is to use the split birdcage coil to measure oxidative metabolism in skeletal muscles of a human thigh. The human subject dataset was acquired from a volunteer with a protocol approved by the institutional review board of the University of Georgia. The MNS surface coil was positioned such that the $^{31}$P coil lay at the midpoint of the thigh offset from the top of the thigh towards the vastus lateralis muscle. The $^{31}$P coil of the split birdcage coil was centered on the midpoint of the thigh. The FID CSI spectral voxels were approximately isotropic cubes measuring 2 cm×2.57 cm×2.57 cm.

Data Processing.

All data processing was done with MATLAB (The MathWorks, Natick, Mass.). From the simulated magnetic field map, a ROI was selected within the boundaries of the coil. For the axial view and the coronal view, the ROI is approximately a 6.33 cm×6.33 cm square, about one third the diameter of the phantom used in the experiment. A measure of the $^{1}$H field sensitivity was displayed with the normalized field maps from the simulations inside the ROI.

The experimental raw FID signal was loaded into MATLAB and then reconstructed with a two dimensional fast Fourier transform of the entire FOV in combination with one dimensional processing to add a line broadening of 3 Hz that was accomplished by taking each spectrum and doing an inverse fast Fourier transform, multiplying the resulting FID-like signal by the Gaussian smoothing function and then fast Fourier transforming back to the frequency domain. The SNR was calculated voxelwise for the $^{31}$P signal FID-CSI grids by building noise vectors from the first 600 data points from each spectrum of 2048 data points. The dominant $^{31}$P peak (PCr) from each spectrum was about 400 data points away from the noise vector. The maximum value from each spectrum was divided by the standard deviation of that spectrum's noise vector to obtain the SNR.

The complete disclosure of all patents, patent applications, and publications, and electronically available material cited herein are incorporated by reference in their entirety. In the event that any inconsistency exists between the disclosure of the present application and the disclosure(s) of any document incorporated herein by reference, the disclosure of the present application shall govern. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

Unless otherwise indicated, all numbers expressing quantities of components, molecular weights, and so forth used in the specification and claims are to be understood as being modified in all instances by the term "about." Accordingly, unless otherwise indicated to the contrary, the numerical parameters set forth in the specification and claims are approximations that may vary depending upon the desired properties sought to be obtained by the present invention. At the very least, and not as an attempt to limit the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. All numerical values, however, inherently contain a range necessarily resulting from the standard deviation found in their respective testing measurements.

All headings are for the convenience of the reader and should not be used to limit the meaning of the text that follows the heading, unless so specified.

What is claimed is:

1. A device comprising:
   a dual-tuned birdcage coil comprising an inner multinuclear coil and a plurality of outer $^{1}$H coils, the plurality of outer coils being longitudinally separated along an axis from the inner coil and not directly connected to the inner coil, the inner coil being inductively coupled to one or more of the outer coils, the inner coil being tunable independently from one or more of the outer coils.

2. The device of claim 1 configured to provide inductive coupling between the inner coil and the plurality of outer coils.

3. The device of claim 1 wherein the multinuclear coil acquires signal from a nucleus other than $^1$H.

4. The device of claim 3 wherein the nucleus is a half-integer spin nucleus.

5. The device of claim 4 wherein the half-integer spin nucleus comprises $^{31}$P, $^{13}$C, $^{15}$N, $^{23}$Na, $^{17}$O, or $^{19}$F.

6. A method comprising:
generating magnetic resonance in a target using a device according to claim 1, wherein the inner coil is tuned independently of one or more of the outer coils.

7. The method of claim 6 wherein the target comprises body tissue.

8. The method of claim 6, further comprising detecting the magnetic resonance generated and digitizing the detected magnetic resonance.

9. The method of claim 8, further comprising creating an image from the digitized magnetic resonance.

* * * * *